United States Patent
Mekhiel

(10) Patent No.: US 9,734,889 B2
(45) Date of Patent: Aug. 15, 2017

(54) RECONFIGURABLE ROW DRAM

(71) Applicant: Empire Technology Development LLC, Wilmington, DE (US)

(72) Inventor: Nagi Mekhiel, Markham (CA)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 273 days.

(21) Appl. No.: 14/579,239

(22) Filed: Dec. 22, 2014

(65) Prior Publication Data

US 2016/0180916 A1    Jun. 23, 2016

(51) Int. Cl.
| | | |
|---|---|---|
| G06F 12/00 | (2006.01) | |
| G11C 11/408 | (2006.01) | |
| G11C 7/10 | (2006.01) | |
| G11C 11/4076 | (2006.01) | |
| G11C 11/4096 | (2006.01) | |

(52) U.S. Cl.
CPC ........ G11C 11/4087 (2013.01); G11C 7/1039 (2013.01); G11C 11/4076 (2013.01); G11C 11/4096 (2013.01); G11C 2207/2209 (2013.01)

(58) Field of Classification Search
CPC combination set(s) only.
See application file for complete search history.

(56) References Cited

U.S. PATENT DOCUMENTS

| | | |
|---|---|---|
| 6,885,591 B2 | 4/2005 | Nong |
| 6,925,028 B2 | 8/2005 | Hosokawa et al. |

OTHER PUBLICATIONS

Mi, W., et al., "Software-Hardware Cooperative DRAM Bank Partitioning for Chip Multiprocessors," In Proceedings of the 2010 IFIP International Conference Network and Parallel Computing (NPC), pp. 329-343 (Sep. 13-15, 2010).

"XDR DRAM," Rambus, accessed at https://web.archive.org/web/20131202075115/http://www.rambus.com/solutions/memory-interfaces/xdm-memory/xdr-dram, accesssed on Aug. 12, 2014, pp. 1-4.

Burger, D., et al., "Memory Bandwidth of Future Microprocessors," Proc. of 23rd annual international symposium on Computer architecture, ACM Press, pp. 78-89 (1996).

Jacob, B., "Memory Systems: Cache, DRAM, Disk," Chapter 8, p. 77 Fig 8.34, ISBN: 9780080553849 Publisher: Morgan Kaufmann (2007).

Jeong, M. K., et al., "Balancing DRAM Locality and Parallelism in Shared Memory CMP Systems," IEEE 18th International Symposium on High Performance Computer Architecture HPCA-18, pp. 1-12 (2012).

McKee, S. A.. et al., "Smarter Memory: Improving Bandwidth for streamed References," IEEE Computer, vol. 31, Issue 7, pp. 54-63 (1998).

(Continued)

*Primary Examiner* — Matthew Bradley
(74) *Attorney, Agent, or Firm* — Turk IP Law, LLC

(57) ABSTRACT

Technologies are generally described herein for a reconfigurable row dynamic random access memory device. The reconfigurable row may correspond to a logically addressable row, where multiple row segments can be mapped to different physical DRAM rows. In some examples, a reconfigurable row dynamic random access memory may use a row segment activator to allow memory operation access to a row segment, while maintaining the remaining part of the same row available for other memory access operations. The reconfigurable row dynamic random access memory may be operated in various modes of operation, including a pipeline mode and a burst mode.

19 Claims, 10 Drawing Sheets

(56) References Cited

OTHER PUBLICATIONS

Moore, S. K., "Multicore is Bad News for Supercomputers, IEEE Spectrum," vol. 45, Issue 11, p. 15 (2008).
Murphy, R., "On the Effects of Memory Latency and Bandwidth on Supercomputer Application Performance," IEEE 10th International Symposium on Workload Characterization, IISWC 2007, pp. 35-43 (2007).
NEC Corporation, "64M-Bit Virtual Channel SDRAM," Data Sheet, Document# M13022EJ8V0DS00 8th edition, pp. 1-100 (Aug. 1998).
Saulsbury, A., et al., "Missing the memory wall: the case for processor/memory integration," ISCA '96, Proceedings of the 23rd annual international symposium on Computer architecture, vol. 24, Issue 2, pp. 90-101 (1996).
Wulf, Wm. A., and McKee, S. A., "Hitting the Memory Wall: Implications of the Obvious," ACM Computer Architecture News, vol. 23, Issue 1, pp. 20-24 (1994).
Zhang, Z., et al., "A permutation-based page interleaving scheme to reduce row-buffer conflicts and exploit data locality," Proceedings of the 33rd Annual IEEE/ACM International Symposium on Microarchitecture, MICRO-33, pp. 32-41 (2000).

RECONFIGURABLE ROW DRAM

BACKGROUND

Multi-core processors include multiple independent central processing units ("CPUs"), sometimes referred to as "cores." The cores in a multi-core processor may have access to a dynamic random-access memory ("DRAM") device. A DRAM device may have a DRAM array comprised of memory cells organized into a series of rows. The rows of memory cells may be further organized into one or more columns. In some DRAM devices, if two or more cores attempt to access the same row of the same DRAM array at the same time, a row conflict may be generated. The row conflict may cause an error as it might be from a different column. To reduce the probability of a row conflict, one processor core may be instructed to wait until a DRAM device access performed by another core has been completed. Overall processing speeds of the multi-core processor may be reduced, including increased overall latency, when one core is instructed to wait until another core completes a memory access.

Unless otherwise indicated herein, the materials described in this section are not prior art to the claims in this application and are not admitted to be prior art by inclusion in this section.

SUMMARY

Briefly stated, technologies are generally described herein for reconfigurable row dynamic random access memory ("RRDRAM") devices. In some implementations, a row of a RRDRAM device may be organized into one or more separately accessible row segments. Utilizing various implementations described herein, one processor core may access a row segment of a row of the RRDRAM device while another processor core may access another row segment of the same row of the RRDRAM device. Utilizing other implementations described herein, a processor core may access a first segment of a first row of the RRDRAM device and, while accessing the segment of the first row, access a first segment of a second row of the RRDRAM device.

In some examples, a RRDRAM device may include an array comprising a row that includes at least one row segment, and a column. A row address latch may be coupled to the array and may be operative to latch a row address of the array. A row decoder may be coupled to the row address latch that may be operative to decode the latched row address. A column address latch may be coupled to the memory address line and may be operative to latch a column address of the array. A column decoder may be coupled to the row address latch and may be operative to decode the latched column address of the array. A column decoder latch may be coupled to the column decoder and may be operative to latch and maintain active an accessed column of the array. A segment decoder may be coupled to the column address latch and may be operative to decode a portion of the column address to identify a segment in the array. A segment decoder activator circuit may be coupled to the segment decoder and may be operative to activate a row segment latch. In some examples, the row segment latch may be coupled to the row decoder and the segment decoder activator circuit. The row segment latch may also be operative to latch the row segment.

In another example, a computer system may include a bus, a processor unit coupled to the bus; and a reconfigurable row dynamic random access memory ("RRDRAM") device coupled to the bus. The RRDRAM device may be operative to perform operations that cause the RRDRAM device to precharge a memory array associated with a first memory location in the memory array. The RRDRAM device may also utilize a row decoder to decode a first row address associated with the first memory location and utilize a column decoder latch to decode a portion of a first column address associated with the first memory location to identify a first row segment of the array. The RRDRAM device may also utilize a row segment activator to activate the first row segment; and assert the activated first row segment to a word line to provide access to data in the first row segment.

In some examples, methods for the operation of a reconfigurable row dynamic random access memory ("RRDRAM") device are disclosed herein. Example methods may include receiving a first access request for a first access to the RRDRAM device, the first access request comprising a first row address and a first column address corresponding to a first memory location in an array. The method may also include precharging the array associated with the first memory location, decoding the first row address; and decoding a portion of the first column address corresponding to a first row segment of the first row address. The method may also include activating the first row segment; and asserting the activated first row segment to a word line to provide access to data in the first row segment.

Another method might include operations for receiving a first memory access of a memory access line comprising a first access row address and a first access column address. The method may include decoding the first access row address to generate a decoded first row, decoding the first access column address to generate a decoded first column and decoding a portion of the first access column address corresponding to a first accessed row segment. The method might further include activating an output corresponding to the first accessed row segment and concurrently with activating the output corresponding to the first accessed row segment, receiving a second memory access of a memory access line comprising a second access row address and a second access column address and accessing first data associated with the first access by asserting an active column. In some examples, the method may include decoding the second access row address to generate a decoded second row, decoding the second access column address to generate a decoded second column and decoding a portion of the second access column address corresponding to a second accessed row segment. The method might also include activating an output corresponding to the second accessed row segment and accessing second data associated with the second access by asserting the second accessed row segment.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
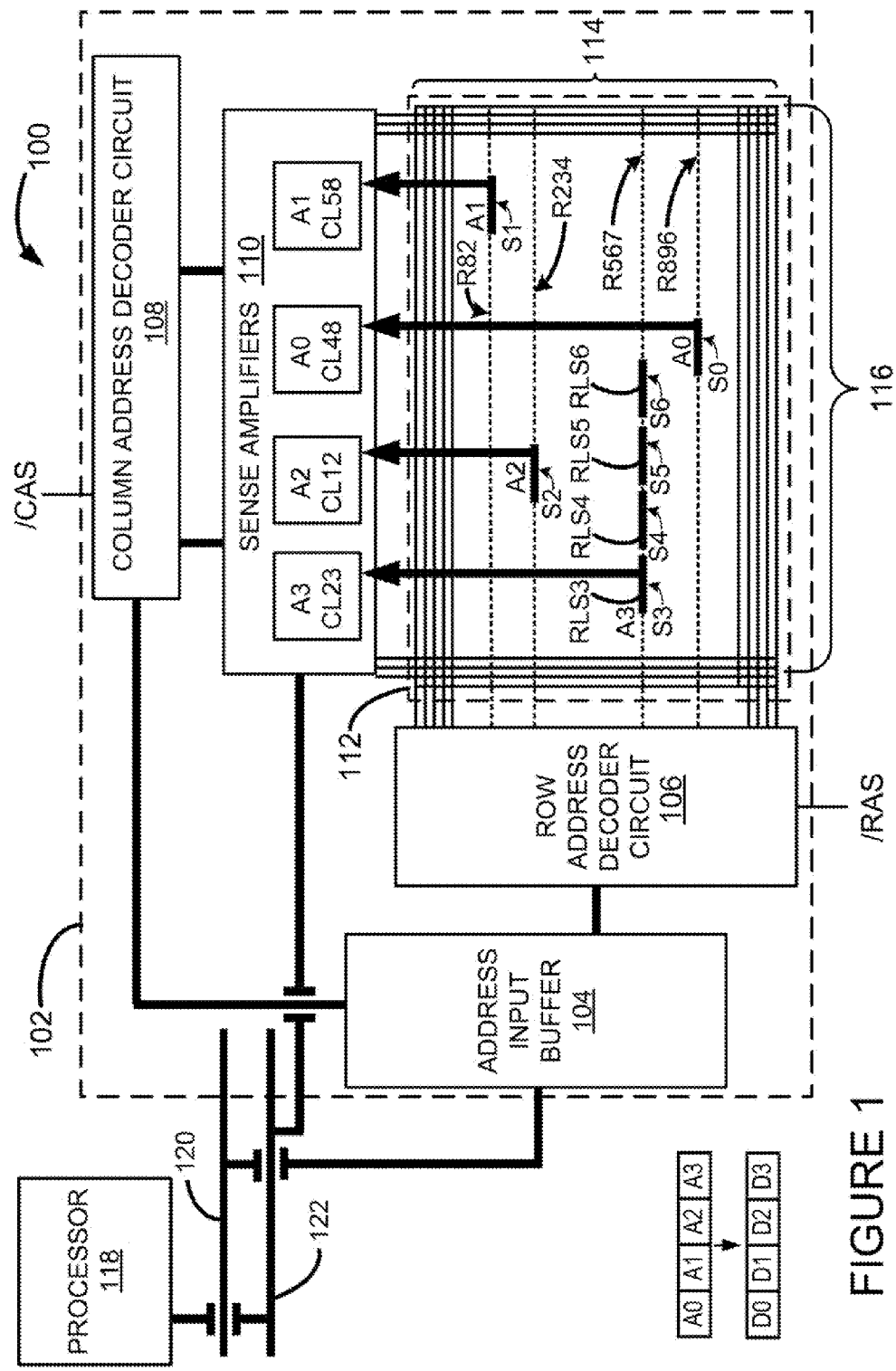
FIG. 1 is a schematic circuit diagram illustrating an example RRDRAM device with reconfigurable rows.

In the following detailed description, reference is made to the accompanying drawings, which form a part hereof. In the drawings, similar symbols may identify similar components, unless context dictates otherwise. The illustrative embodiments described in the detailed description and drawings are not meant to be limiting. Other embodiments may be utilized, and other changes may be made, without departing from the spirit or scope of the subject matter presented herein.

The aspects of the present disclosure, as generally described herein, and illustrated in the figures, can be arranged, substituted, combined, separated, and designed in a wide variety of different configurations, all of which are explicitly contemplated herein. Further, one or more components of various figures described below may not be included in the figure for purposes of clarity. This should not be construed as a disclaimer or admission that the non-included components do not form part of the subject matter described herein. Additionally, one or more figures may use a "dashed" line as a border to visually encapsulate one or more components. Unless specifically described otherwise, the use of a dashed line is for purposes of illustration and does not reflect functional or physical boundaries.

This disclosure is generally drawn, inter alia, to technologies for RRDRAM devices. In some examples, an RRDRAM device may include a memory cell array that may be organized as a set of physical rows and columns. One or more of rows of the RRDRAM devices may be logically partitioned into one or more row segments. Some examples of row segment logical partitions may include row segments organized from a portion of a column of a row, row segments organized from multiple columns of a row, and row segments organized from multiple portions of columns of a row. Some examples of RRDRAM devices may be configured to selectively provide access to one or more row segments of one or more rows of the RRDRAM device. A row segment activator in the RRDRAM device may be configured to selectively activate the one or more segments in one or more rows to facilitate a memory access operation.

FIG. 1 is a schematic circuit diagram illustrating an example computing system 100 with a RRDRAM device 102, arranged in accordance with at least some embodiments described herein. The system may include a processor 118, an address bus 120, a data bus 122, and the RRDRAM device 102.

The RRDRAM device 102 may include an address input buffer 104, a row address decoder circuit 106, a column address decoder circuit 108, sense amplifiers 110, and a DRAM array 112. The row address decoder circuit 106 and the column address decoder circuit 108 may each include a latch circuit (not shown) and/or a decoder circuit (not shown), as will be illustrated and described by way of example in FIG. 3 below. The DRAM array 112 may be arranged as a collection of physical rows 114 and columns 116 of memory cells.

The processor 118 may be coupled to the RRDRAM device 102 via the address bus 120 and the data bus 122. The address input buffer 104 may be coupled to the processor 118 via the address bus 120. The sense amplifiers 110 may be coupled to the processor 118 via the data bus 122. The sense amplifiers 110 may also be coupled to the address input buffer 104 via the column address decoder circuit 108. The DRAM array 112 may be coupled to the address input buffer 104 via the row address decoder circuit 106 and may also be coupled to the column address decoder circuit 108 via the sense amplifiers 110.

In some examples, the DRAM array 112 may be organized as a collection of physical rows 114 and columns 116. Example physical rows 114 illustrated and identified are row R82, row R234, row R567, and row R896. The physical rows 114 may be logically partitioned into row segments. For purposes of illustration, the physical row R82 may include a row segment S1. The physical row R234 may include a row segment S2. The physical row R567 may include row segments S3-S6, and the physical row R896 may include a row segment S0. In some configurations, one or more of the physical rows 114 may include more than or fewer than the number of row segments illustrated. The RRDRAM device 102 may also include one or more row segment activators, illustrated and described in additional detail in FIGS. 2 and 3. Example row segment activators illustrated in FIG. 1 for the row R567 include RLS3, RLS4, RLS5, and RLS6. Other row segments of the DRAM array 112 may also be associated with row segment activators.

The row segment activators may be configured to activate a row segment associated with a memory address received by the address input buffer 104 via the address bus 120. In some examples, the memory address received by the address input buffer 104 may correspond to more than one row segment of the same row. In other examples, the memory address received by the address input buffer 104 may correspond to row segments in multiple rows. In some configurations, remaining portions of a row not associated with activated row segments may remain de-activated and available for access by another core of the processor 118 (or another core of another processor).

In some examples of a read operation, the processor 118 may place memory addresses A0-A3 on the address bus 120 to read data D0-D3. The address input buffer 104 may be configured to receive and buffer the memory address. In some configurations, a first portion of the memory addresses A0-A3 may identify one or more rows in the DRAM array 112 and a second portion of the memory addresses A0-A3 may identify one or more columns in the DRAM array 112.

According to some examples, a row access strobe ("/RAS") signal may be set to active (e.g., a logical high) that may cause the row address decoder circuit 106 to read the address input associated with the rows from the address input buffer 104. The decoded rows may be stored in one or more of the row segment latches, illustrated in more detail in FIG. 2.

A column access strobe ("/CAS") signal may be set to active (e.g., a logical high) to facilitate the decoding of the column portions of the memory addresses by the column address decoder circuit 108. The column address decoder circuit 108 may receive the column addresses from the address input buffer 104 and decode the column addresses. In some examples, the column addresses may have two parts. A first part may be a segment number and may be assumed to be the high order bits of the column address. A second part may be a column number in a segment and may be the low order address bits of the column addresses. The row address decoder circuit 106, in combination with the column address decoder circuit 108, may cause the row segments associated with the memory addresses A0-A3 to be selectively activated. In the present example, the row segments associated with the memory addresses A0-A3 may be S0-S3.

In some configurations, the row segments S0-S3 may be located in more than one row. For example, the row segment S0 may be found in physical row R896. The row segment S1 may be found in physical row R82. The row segment S2 may be found in physical row R234, and the row segment S3 may be found in physical row R567. In some examples, the row segments S0-S3 may be activated independently from their respective rows. In these examples, other than their respective latched row segments S0-S3, the rows R82, R234, R567, and R896 may remain available such that additional memory operations may be performed on rows 114 while the row segments S0-S3 are activated. For example, while the segment S3 of the row R567 is latched, the segments S4-S6 may be accessed by other cores of the processor 118 (not shown) or other processors (not shown) for memory operations such as read and write. Additional details regarding this process will be provided below. In some examples, a logical row may be formed when the row segments S0-S3 are activated in a manner that facilitates the coordinated use of the row segments S0-S3 in a manner that is similar to the use of a physical row.

A memory operation (read or write) on the RRDRAM device 102 may be performed in various ways. In some examples, a memory operation on the RRDRAM device 102 may be performed in a pipelined mode of operation or a burst mode of operation. In a pipelined mode of operation, data for each access may be validated and made ready when the particular access is completed. In a burst mode of operation, the data for each access may be validated and made ready when all of the particular accesses are completed. Examples of pipeline and burst modes of operation are provided in relation to FIGS. 4 and 5, respectively.

Figure 2:
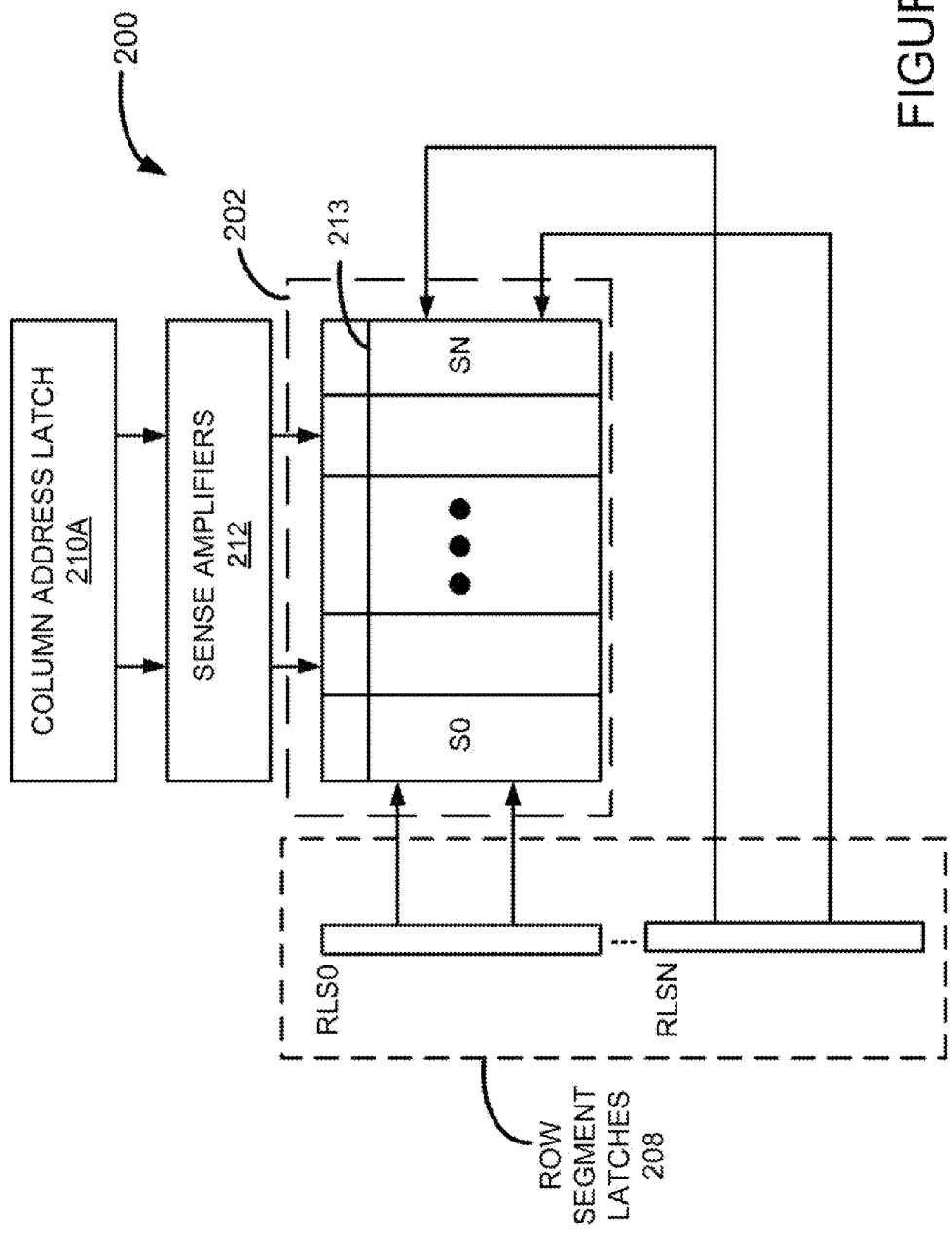
FIG. 2 is a schematic circuit diagram illustrating a possible operation of row segment latches for an example RRDRAM device.

FIG. 2 is a schematic circuit diagram illustrating a possible operation of row segment latches for an example RRDRAM device (e.g., the RRDRAM device 102 in FIG. 1), arranged in accordance with at least some embodiments described herein. The example RRDRAM device 200 of FIG. 2 may include a DRAM array 202, row segment latches 208, column address latch 210A, and sense amplifiers 212.

The row segment latches 208 may be coupled to the DRAM array 202. The column address latch 210A may be coupled to the DRAM array 202 via the sense amplifiers 212. In some examples, the column address latch 210A may be a component of a column address decoder circuit, such as by way of example, the column address decoder circuit 108 described in FIG. 1 above. The RRDRAM device 200 may be configured to store the column address in the column address latch 210A.

The DRAM array 202 may include multiple row segments S0 to SN that may be independently latchable. In some configurations, the row segment latches 208 may be configured to latch and activate the row segments S0 to SN. Individual row segment latches 208 may be identified as RLS0 to RLSN. Each of the row segment latches 208 may be configured to latch a corresponding one of the row segments S0 to SN, respectively.

The row segment latches RLS0-RLSN may be configured to receive an access request for a decoded row segment (or specific row segment) and responsively latch the specific row segment. The outputs of the row segment latches RLS0-RLSN may be arranged to selectively activate the one or more word lines of the specific row segment, with the one or more outputs of the particular row segments S0-SN corresponding to a specific word line of the DRAM array, such as the word line 213. When a memory access is performed on a RRDRAM device 200, a particular segment of a row may be latched without activating the entire row. By latching a particular segment of the row without activating the entire row, the remaining segments of the row may remain available for concurrent access by another processor or processor core.

Figure 3:
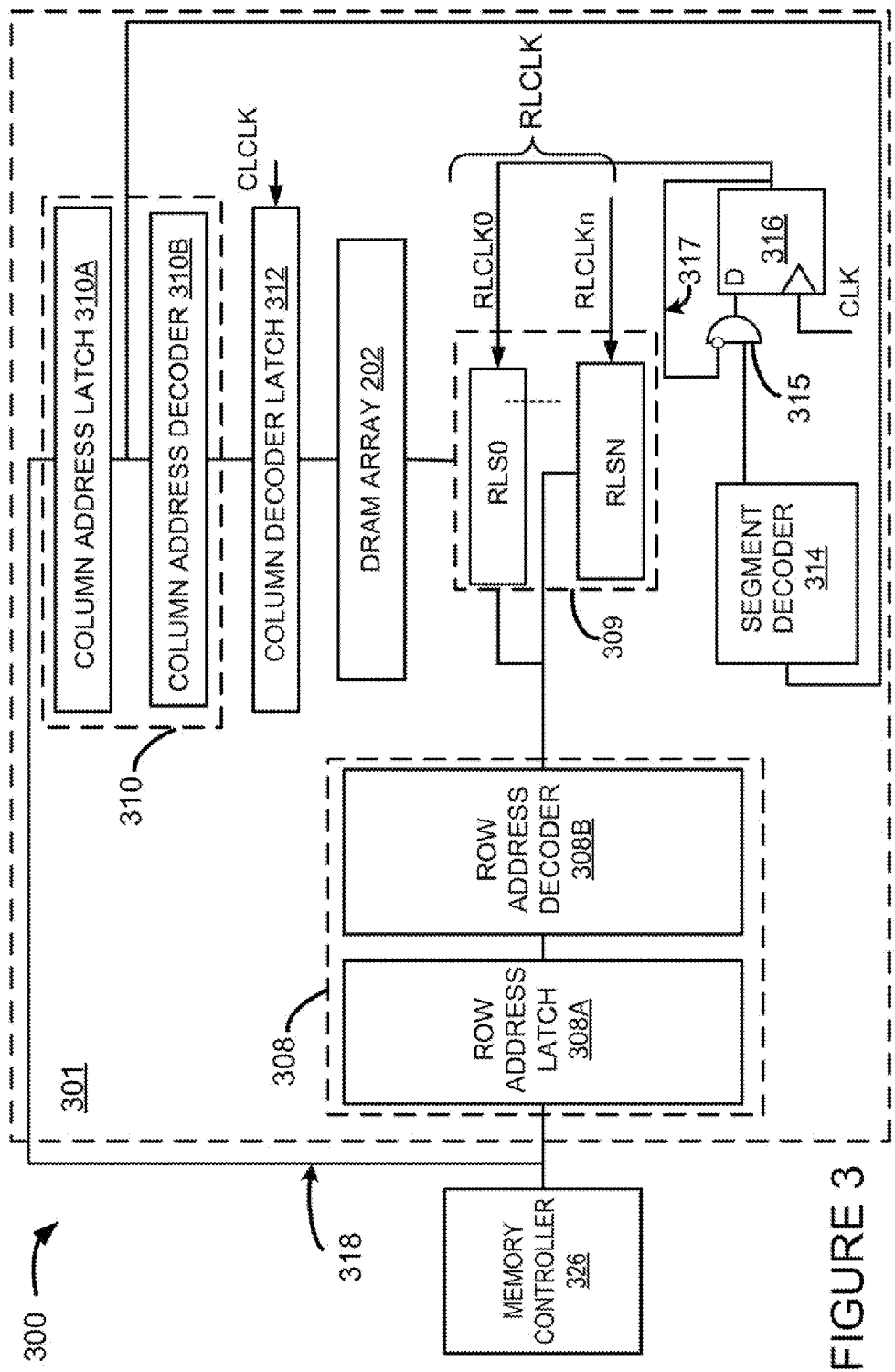
FIG. 3 is a schematic circuit diagram illustrating an example RRDRAM system operative to perform memory operations.

FIG. 3 is a schematic circuit diagram illustrating an example RRDRAM system 300 operative to perform memory operations, arranged in accordance with at least some embodiments described herein. The RRDRAM system 300 may include a memory controller 326 and an RRDRAM device 301. The RRDRAM device 301 may include the DRAM array 202, a row address decoder circuit 308, row segment latches 309, a column address decoder circuit 310, a column decoder latch 312, a segment decoder 314, a segment decoder activator circuit 316, and a logic gate 315.

The row address decoder circuit 308 may include a row address latch 308A and a row address decoder 308B. The column address decoder circuit 310 may include a column address latch 310A and a column address decoder 310B. The RRDRAM device 301 may also include row segment latches 309 that may be coupled to the DRAM array 202, further identified at least partially as RLS0-RSLN (see similar discussion in FIG. 2 above).

The memory controller 326 may be coupled to the row address latch 308A of the row address decoder circuit 308. The memory controller 326 may also be coupled to the column address latch 310A of the column address decoder circuit 310. The row address latch 308A may be coupled to the row segment latches 309 via the row address decoder 308B. The column address latch 310A may be coupled to the column address decoder 310B and the segment decoder 314. The column address decoder 310B may be coupled to the column decoder latch 312 that may be coupled to the DRAM array 202. The segment decoder 314 may be coupled to the segment decoder activator circuit 316 through logic gate 315. The logic gate 315 may be any variety of logic gate such as an AND, NAND, OR, NOR, XOR, XNOR, or any other appropriate component or combination thereof that is usable to provide logic gate operation.

The memory controller 326 may be configured to interface with the RRDRAM device 301 to selectively control memory operations associated with the RRDRAM device 301. In some configurations, the row address latch 308A may be configured to latch a row address when the memory controller 326 asserts a memory address. For example, the memory controller 326 may assert a row access strobe ("/RAS") signal to indicate that a valid row is ready for access. In some configurations, the row address latch 308A may be configured to latch a row address of (e.g., address A0-A3), and the latched row address can be decoded by the row address decoder 308B to determine the row address from the memory address asserted by the memory controller 326.

In some examples, the column address latch 310A may be configured to latch a column address when the memory controller 326 asserts a memory address. For example, the memory controller 326 may assert a column access strobe ("/CAS") signal to indicate that a valid column is ready for access. The particular column address may be latched by the column address latch 310A and then decoded by the column address decoder 310B to determine the column address from the memory address asserted by the memory controller 326.

In some examples, a column address may include two parts. The first part of the column address may be a segment number, which in some examples may correspond to the higher order bits of the column address. The second part of the column address may be the column number within a segment, which in some examples may correspond to the lower order bits of column address.

The column decoder latch 312 may be configured to receive decoded column information from the column address decoder 310B. The column decoder latch 312 might also be configured to latch the decoded address and maintain active an accessed column. In some examples, the column decoder latch 312 may be configured to latch an output of the column address decoder 310B when a clock signal CLCLK is asserted for a valid column address. The column decoder latch 312 may also be configured to continue to keep active an output for each of the accessed column addresses in any particular access.

In some configurations, the segment decoder 314 may be configured to decode the portion of column address that is responsible for selecting a segment in one of the rows 304 of a DRAM array, such as the DRAM array 112 of FIG. 1. In some examples, one output of the segment decoder 314 may be asserted to activate a particular segment for access. In this manner, the RRDRAM system 300 may be arranged to maintain multiple outputs active, where each active output may correspond to a different accessed columns for a different accessed row.

A row clock (RLCLK) signal is illustrated by way of example as a row clock (RLCLK0) signal for a row segment latch RLS0 and a row clock (RLCLKN) signal for a row segment latch (RLSN). The segment decoder activator circuit 316 may be configured to receive an input from the column address latch 310A for its corresponding row segment latch. In FIG. 3, the segment decoder activator circuit 316 is illustrated as corresponding to the row segment associated with the row segment latch RLS0. One or more of the row segment latches (not shown) may have corresponding segment decoder activator circuits. Although the segment decoder activator circuit 316 is illustrated as a flip-flop circuit that is clocked by a clock signal CLK, other types of circuits or technologies may be used and are considered to be within the scope of the present disclosure.

The segment decoder activator circuit 316 may be configured to generate one or more clock cycles due to an inverted feedback loop 317 from an output terminal of the segment decoder activator circuit 316 to an input terminal of the logic gate 315. The inverted feedback loop 317 may be configured to cause the storage of the selected decoded row segment decoded row in the corresponding row segment latch RLS0-RLSN.

In some examples, the accessed row may correspond to a particular row and the selected row segment may correspond to a particular row segment. The output of the row address decoder 308B corresponding to the row may be asserted as a logical high (e.g., "1") signal. In some examples, the inverted feedback loop 317 may be operative to maintain an output active during subsequent accesses. The flip-flop circuit coupled to the output of the segment decoder 314 may be configured to generate a clock pulse that latches a row. In some configurations, one or more capacitors may be used in lieu of the row segment latches 309, as will be described in FIG. 7, below.

As noted above, the RRDRAM system 300 may be operated in various modes of operation. For example, the RRDRAM system 300 may be operated in a pipelined mode of operation or a burst mode of operation. In a pipelined mode of operation, the data for each access may be validated and made ready when the particular access is completed. In a burst mode of operation, the data for each access may be validated and made ready when all of the particular accesses are completed.

Figure 4:
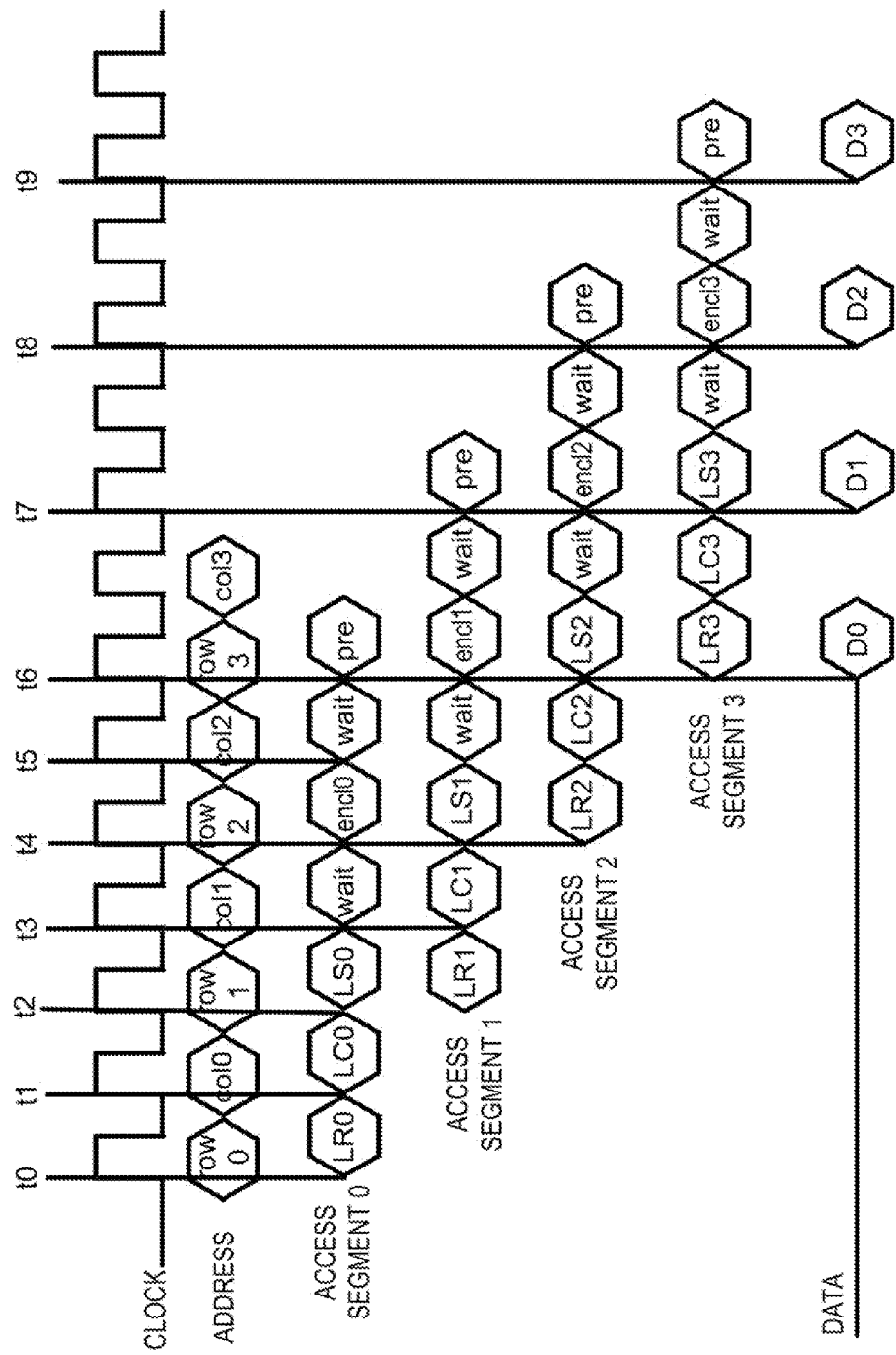
FIG. 4 is a signal timing diagram for an example pipelined mode of operation for an example RRDRAM device.

FIG. 4 is a signal timing diagram for an example pipelined mode of operation for an example RRDRAM device, arranged in accordance with at least some embodiments described herein.

In a pipelined mode of operation, at time t0 the row address of a first memory access may be applied to an address bus, such as the address bus 120, by an RRDRAM system, such as the RRDRAM system 300. The row address of the first memory access may also be latched by row address latch 308A using the /RAS signal. The row address decoder 308B decodes the row address.

At time t1, the memory controller 326 may apply a column address of the first access to the address bus. The column address may be latched by a column address latch 310A using the /CAS signal. The column address decoder 310B may decode the column address. Further, the segment decoder 314 may decode the portion of that address corresponding to the segment selection and makes one output active, for example, the RLCLK0 signal, that corresponds to the accessed row segment.

At time t2, a second memory access may be commenced by applying a row address to the address bus in a manner similar to the first access in t0. Further, the RRDRAM system 300 may continue processing the first access by latching the decoded row from the row address decoder 308B in the corresponding row segment latch, by way of example row segment latch RL0, by the signal generated from the segment decoder 314. The RRDRAM system 300 may also latch the decoded column for the first access in the column decoder latch 312, and maintains any prior accessed columns active.

At time t3, the first access process may wait until the first accessed segment is active and applied to a word line of the selected row segment from the corresponding row segment latch. The second access may be continuing similar to the first access. In some configurations, the first access column has been captured and stored in the column decoder latch 312 at time t1.

At time t4, in the first access, the active column may be asserted to a bit line to facilitate the accessing of the data. In the second access, the decoded row and the decoded column in the corresponding row segment may be latched in a manner similar to the first access in t2. In some configurations, in a third access, a row address may be applied to the address bus similar to the first access and second access.

At time t5, in the first access, a period of time may be provided to wait for data to be retrieved. In the second access, a period of time is provided to wait In the third and fourth accesses, latch the column address is latched and decoded in a manner similar to the first access.

At time t6, the data of the first access may be read and validated. In the second access, the active column may be asserted to a bit line to facilitate the accessing of the data. The decoded row from the third access may be latched from the row address decoder 308B in the corresponding row segment latch by a clock signal generated from the segment decoder 314. Further, the RRDRAM system 300 may latch the decoded column for the second access in the column decoder latch 312 and keep previous accessed columns active. At time t7, the second access data may be ready.

At time t8, the third access data may be ready. At time t9, the fourth access data may be ready. In some configurations, at time t6, the RRDRAM system 300 may start precharging the decoded segment in the first access. In this manner, the precharge time may be hidden and pipelined with other accesses. The second, third, and fourth accesses may follow the same method, thereby making all accesses pipelined in precharge, latching, decoding, access time, and data delivery.

Figure 5:
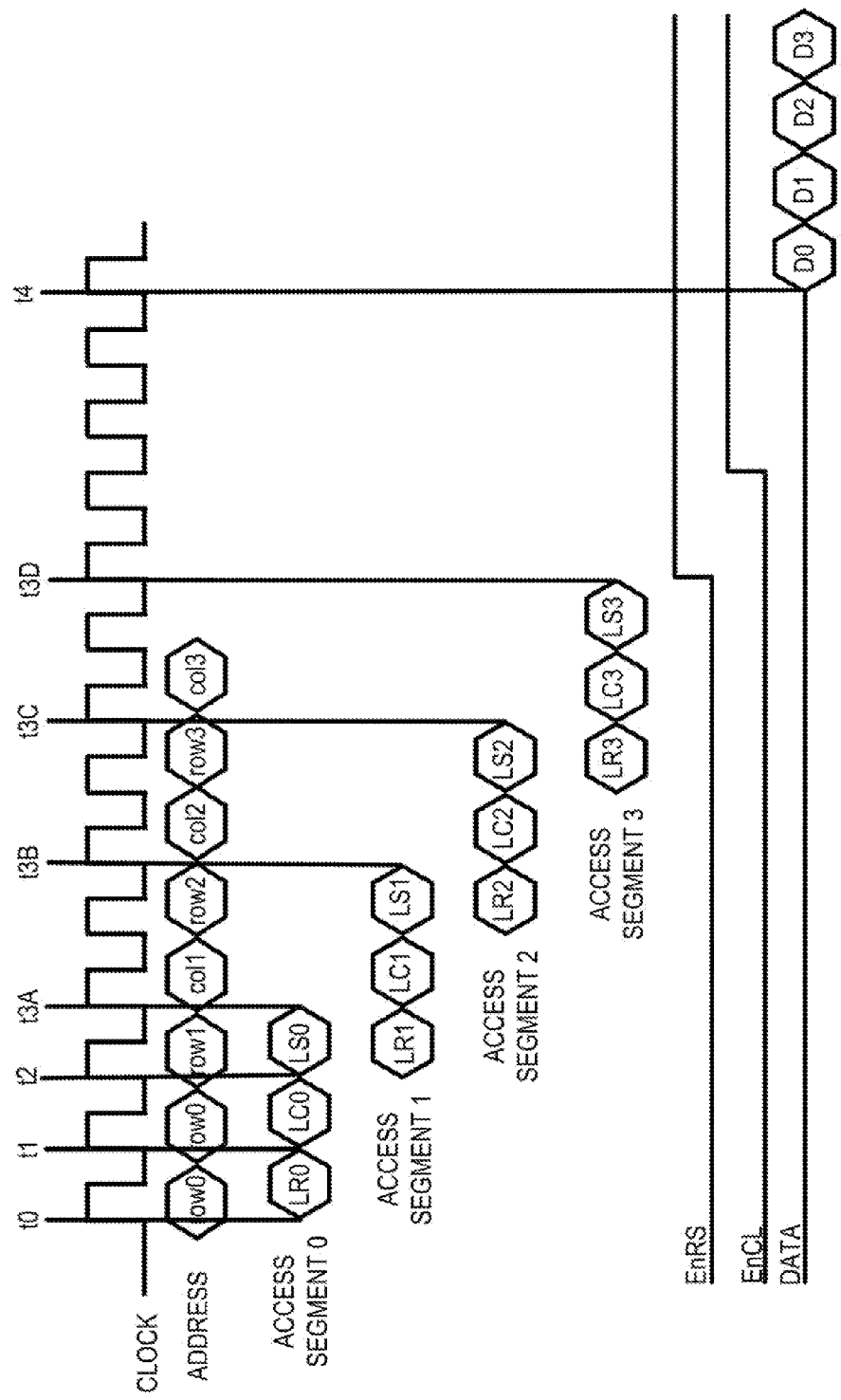
FIG. 5 is a signal timing diagram for an example burst mode of operation for an example RRDRAM device.

FIG. 5 is a signal timing diagram for an example burst mode of operation for an RRDRAM device, such as the RRDRAM device 102 of FIG. 1, in accordance with at least some embodiments described herein. At time t0, the row address of the first access may be applied to an address bus, such as the address bus 120, and may be latched by the row address latch 308A. The row address decoder 308B may decode the row address.

At time t1, the memory controller 326 may apply the column address of first access to the address bus and may be latched by the column address latch 110A. The column address decoder 310B may decode the column address. The segment decoder 314 may decode the latched segment address and may make one output active that corresponds to the accessed row segment.

During time t2, the RRDRAM system 300 may start the second access by applying the row address of second access similar to the first access at time t0. Also, the RRDRAM system 300 may continue with the first access by latching the decoded row from the row decoder in the corresponding row segment latch by use of a clock signal generated from the segment decoder circuit 312. Further, the RRDRAM system 300 may latch the decoded column for the first access in the column decoder latch and may maintain previous accessed columns in the active latch by the feedback. Latching all accessed rows and columns may involve a certain number of cycles. In some examples, the number of cycles involved may be the number of accesses multiplied by two. Latching accessed rows and columns may form the logical reconfigurable row, thereby allowing access to data.

At times t3A-t3D, each accessed segment partial row may be activated by coupling row segment latch outputs to word lines of corresponding segments. In some configurations, one partial row may be activated per each segment. The decoded row segment latches RLS0-RLSN may apply their respective active outputs to word lines at the same time forming the reconfigurable logical row that maps to different physical rows in the different segments. For segments that are not accessed, their corresponding rows may remain precharged and ready to be activated. In some configurations, precharging segments may provide power and time savings benefits.

After time t3D, the RRDRAM system 300 may be configured to standby for some period of time or application of a signal, which in some configurations may take two or more clock cycles. Further, the active columns may be applied to one or more bit lines to provide for the access of the data through the sense amplifiers 110. Additionally, the RRDRAM system 300 may be configured to standby for some period of time or an application of a signal, which may be used to access columns to allow the data to be latched in the sense amplifiers 110.

The RRDRAM system 300 may receive an EnRS signal to activate each partial row through applying the output of its row segment latch to a word line of the segment. The RRDRAM system 300 may also receive an EnCL signal to activate bit lines from the column latch for the different columns latched by the column decoder latch 312.

Figure 8:
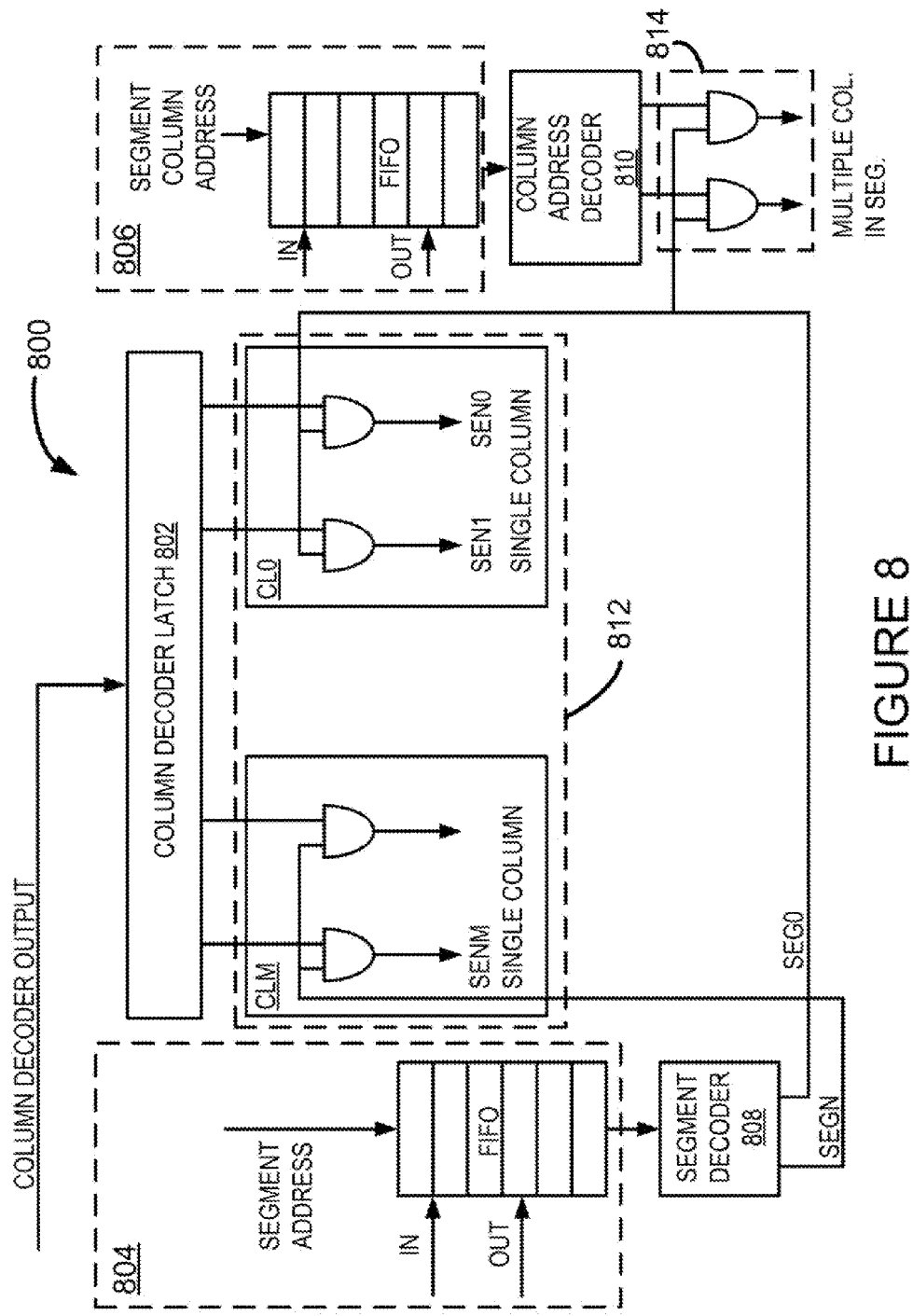
FIG. 8 is a schematic circuit diagram of a first-in/first-out system that may be configured to facilitate access to data in an example RRDRAM device based upon the order of the arrival of access requests on an address bus.

After waiting for the period of time or the signal, at time t4, the data may be accessed. In some examples, the data may be accessed from the first cell by the order of their arrival using a first-in/first-out ("FIFO") circuit, as illustrated in FIG. 8. In some examples, the burst mode of operation may be advantageous in that it may deliver data at the rate of 1 cycle from an access regardless of the data location in the RRDRAM system 300.

Figure 6:
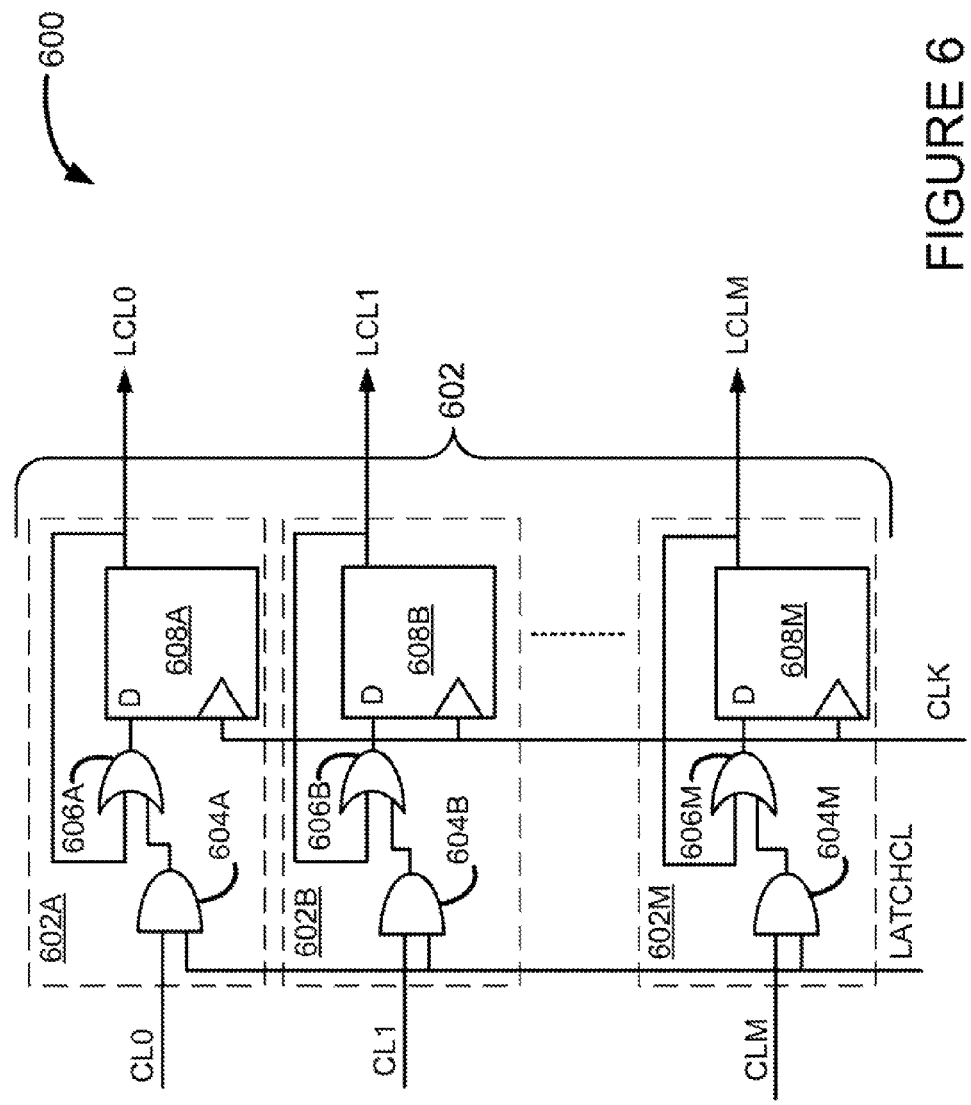
FIG. 6 is a schematic circuit diagram illustrating a column decoder latch that may be used with an RRDRAM device.

FIG. 6 is a schematic circuit diagram illustrating a column decoder latch 600 that may be used with an RRDRAM device, such as the RRDRAM device 102 of FIG. 1, in accordance with at least some embodiments described herein. As illustrated, the column decoder latch 600 may include a column storage device 602 that may include column storage devices 602A-602M. In some configurations, each of the column storage devices 602A-602M, may include a logic gate (e.g., logic gates 604A-604M), a logic gate (e.g., logic gates 606A-606M), and a flip-flop circuit (e.g., flip-flop circuits 608A-608M), operatively coupled to each other. The logic gates 604A-604M or the logic gates 606A-606M may be any variety of logic gates such as an AND, NAND, OR, NOR, XOR, XNOR, or any other appropriate component or combination thereof suitable to provide logic gate operation.

The logic gates 604 of the column storage devices 602 may receive as an input a clock signal, CL0-CLM (corresponding to the particular column storage device 602). The logic gates 604 of the column storage devices 602 may also receive as an input a LATCHCL signal generated when a valid column access is requested by a processor, such as the processor 118 of FIG. 1. The output of the logic gates 604 may be received as an input to the logic gates 606. The logic gates 606 also may receive as an input a feedback from the flip-flop circuits 608. The output of the logic gates 606 may be received as an input to the flip-flop circuits 608. The flip-flop circuits 608 also receive as an input a CLK signal. The CLK signal may be configured to synchronize the operation of the flip-flop circuits 608.

One or more of the column storage devices 602 may correspond to a particular column of a DRAM array, such as the DRAM array 112 of FIG. 1. For example, the column storage device 602A may correspond to a particular column, the column storage device 602B may correspond to another column, and the column storage device 602M may correspond to a still further column.

The column storage devices 602 of the column decoder latch 600 may be operative to store the address of a column of a physical row. In some examples, when there is a valid access and a column address decoder, such as the column address decoder 310B of FIG. 1, asserts an active signal for a specific column of a DRAM array, such as the DRAM array 112 of FIG. 1, the column decoder latch 600 may store the access in the corresponding one of the column storage devices 602 using a LATCHCL signal and a clock edge. The LATCHCL signal may be generated when a valid column access is requested. The corresponding one of the column storage devices 602 may maintain a particular decoded column active and stored until a subsequent access of one or more row segments.

The following is an example of an operation using multiple active output columns in the column decoder latch 600. A processor, such as the processor 118 of FIG. 1 and another processor or two or more cores, may request the following data from the following example row segments: row#34, col#29; row#734, col#130; and row #12, col#100. During a first access, col#29 may be activated, the column decoder latch 312 may store the column portion of the address associated with col#29 in flip-flop#29, and LCL29 may become=1 and may stay=1 because of the feedback. The second access may activate col#130, the column decoder latch may store it in flip-flop#130, and LCL130 may become=1 and may stay=1. The third access may activate col#100, and the column decoder latch may store it in flip-flop#100, and LCL100 may become=1 and may stay=1. In some examples, the result of the access and activation process may latch and make available the segments associated with the row/column combinations described above.

Figure 7:
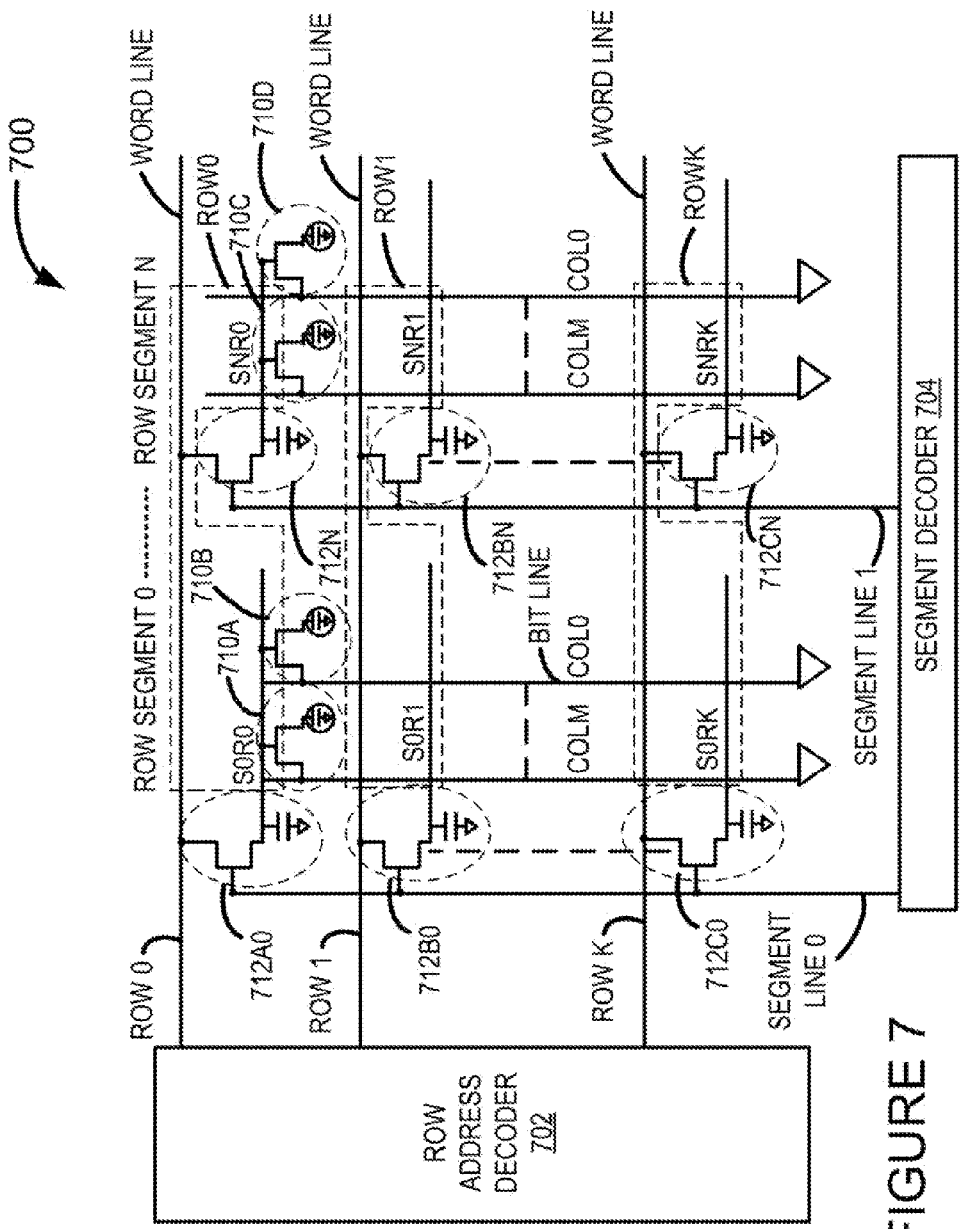
FIG. 7 is a schematic circuit diagram illustrating a RRDRAM device that utilizes a row of capacitors that are configured as row segment activators.

FIG. 7 is a schematic circuit diagram illustrating a RRDRAM device 700 that utilizes a row of capacitors that are configured as row segment activators, in accordance with at least some embodiments described herein. The RRDRAM device 700 may include a row address decoder 702 and a segment decoder 704. The RRDRAM device 700 may further include one or more rows of memory cells, identified generally in FIG. 7 as "ROW 0," "ROW 1," and "ROW K." The rows of the memory cells may be comprised of one or more memory cells. Example memory cells identified are memory cells 710A, 710B, 710C and 710D ("hereinafter referred to collectively and/or generically as "memory cells 710") corresponding to ROW 0. The memory cell rows ROW0-ROWK may be organized into one or more row segments. The row segments are identified generally in FIG. 7 as "ROW SEGMENT 0" to "ROW SEGMENT N." The row segment for a particular row is identified in a general manner. For example, "S0R0" corresponds to the first segment of the first row and "S0R1" corresponds to the first segment of the second row, and so forth.

The RRDRAM 700 may also include activators 712A0, 712AN, 712B0, 712BN, 712CK, and 712CN ("hereinafter referred to collectively and/or generically as "activators 712"). The activators 712 may be comprised of a transistor having a first terminal coupled to a word line, a drain coupled to a first terminal of a capacitor and a control terminal coupled to the segment decoder 704. The second terminal of the capacitor of the activators 712 may be coupled to a second potential acting as a reference voltage.

The drain of the transistors of the activators 712 may be coupled to a control terminal of a transistor of one or more memory cells. The transistor of the memory cells 710 may also have a first terminal coupled to a bit line and a second terminal coupled to a third potential. The RRDRAM device 700 may include other components not identified, described or illustrated in FIG. 7, for the sake of brevity and simplicity.

The row of capacitors may activate a row segment in accordance with at least some embodiments described herein. In some examples, the activators 712 may be used to activate one or more word lines of RRDRAM device 700. In one example operation, when a particular row segment is to be activated, the row address decoder 702 may activate the word line and the segment decoder 704 may activate the segment line corresponding to the row segment to be activated. The activators 708 at the row for the particular row segment and row may be charged, while the activators 708 not at the row for the particular row segment will be at a lower potential. In some configurations, the use of the activators 712 may allow the activation of a particular row segment without the use of row segment latches, such as the row segment latches RLS0-RLSN of FIG. 2.

FIG. 8 is a schematic circuit diagram of a first-in/first-out system 800 that may be configured to facilitate access to data in an example RRDRAM device, such as the RRDRAM device 102 of FIG. 1, based on the order of the arrival of access requests in the address bus, in accordance with at least some embodiments described herein. The FIFO system 800 may include a column decoder latch 802, a FIFO device 804, a FIFO device 806, a segment decoder 808, a column address decoder 810, a RRDRAM array 812, and logic circuits 814 (which may include AND logic circuits), operatively coupled to each other. The DRAM array 812 may include one or more memory cells organized into columns, identified in FIG. 8 as columns CLM-CL0.

The column decoder latch 802 outputs signals that may be used by AND logic circuits 812. An output of the segment decoder 808, illustrated as SEG0-SEGN, may become active based on the output of the FIFO device 804. Output signals from the segment decoder 808 may also be used by the AND logic circuits 812. In some examples, the number of outputs of the segment decoder 808 may be dependent on the number of segments in the RRDRAM array 812. For example, in a 16 segment system, the number of outputs of the segment decoder 808 may be sixteen (16).

If accesses are arriving in the order of column #148, column#254, column #23 and then column #567, the FIFO device 804 may be used to store, in the order of their arrival, the segment address (e.g., 4 bits) of arriving addresses when "IN" signal is active. The segment addresses of these columns in the same order of their arrival are: seg#2, seg#3, seg#0, and seg#8, assuming 1024 columns divided into 16 segments and each has 64 columns.

In some examples, when the FIFO system 800 is ready to access data from a sense amplifier, the OUT signal in the FIFO device 804 may become active. The first output from the FIFO device 804 may be seg#2, which may be decoded by the segment decoder 808. A SEG2 signal may become active and may be coupled to the AND gates of a column decoder latch of segment 2 (column 128 to column 191). The AND that has column#148 input may generate an active signal to access data from a sense amplifier. Similarly, the next access may be column#254 in the next clock cycle, followed by column#23 in clock cycle 3, and the last access may be to column#567 in clock cycle 4.

In various examples, the circuit of FIG. 8 may support a multiple column accesses from the same segment using the logic circuit 814 in place of a column decoder latch and AND gates. Each segment may use the logic circuit 814, for a total of 16 in this example. The FIFO device 806 may be used to latch a column address in a segment, which in this present example is 6 bits for 64 columns per each segment. Continuing with the example, the following column accesses may arrive in the following order: column#148, column#254, column#23, and column#198. Column#148 may be in seg#1, and may activate segment column#20.

Column#254 may be in seg#3 and may activate segment column#62. Column#23 may be in segment#0 and may activate segment column#23. Column#198 may be in segment#3 and may activate segment column#6.

In this example, the FIFO device 804 and the FIFO device 806 may operate in parallel to activate a sense amplifier 110 in the following manner. In a first operation, a first access to column#148 may have seg#1 active from the FIFO device 804 and also col#20 active from the column address decoder associated with the FIFO device 806. The operation may generate an active signal=1 on the col#20 of seg#1 to access the sense amplifier.

In a second operation, column#254 may have seg#3 active while column#62 may become active from FIFO device 806, causing a sense amplifier to be active to access column#254. During the second operation, column#198 in the same segment may not be active because the output of the column address decoder 310 may generate a zero, making the AND output=0.

In a third operation, the third access to column#23 may have seg#0 active from the FIFO device 804 and column#23 active from the FIFO device 806 to access the data in a sense amplifier corresponding to column#23. In a fourth access, column#198 may have seg#3 active again from the FIFO device 804 and column#6 active from the FIFO device 806 to access data for column#198.

Figure 9:
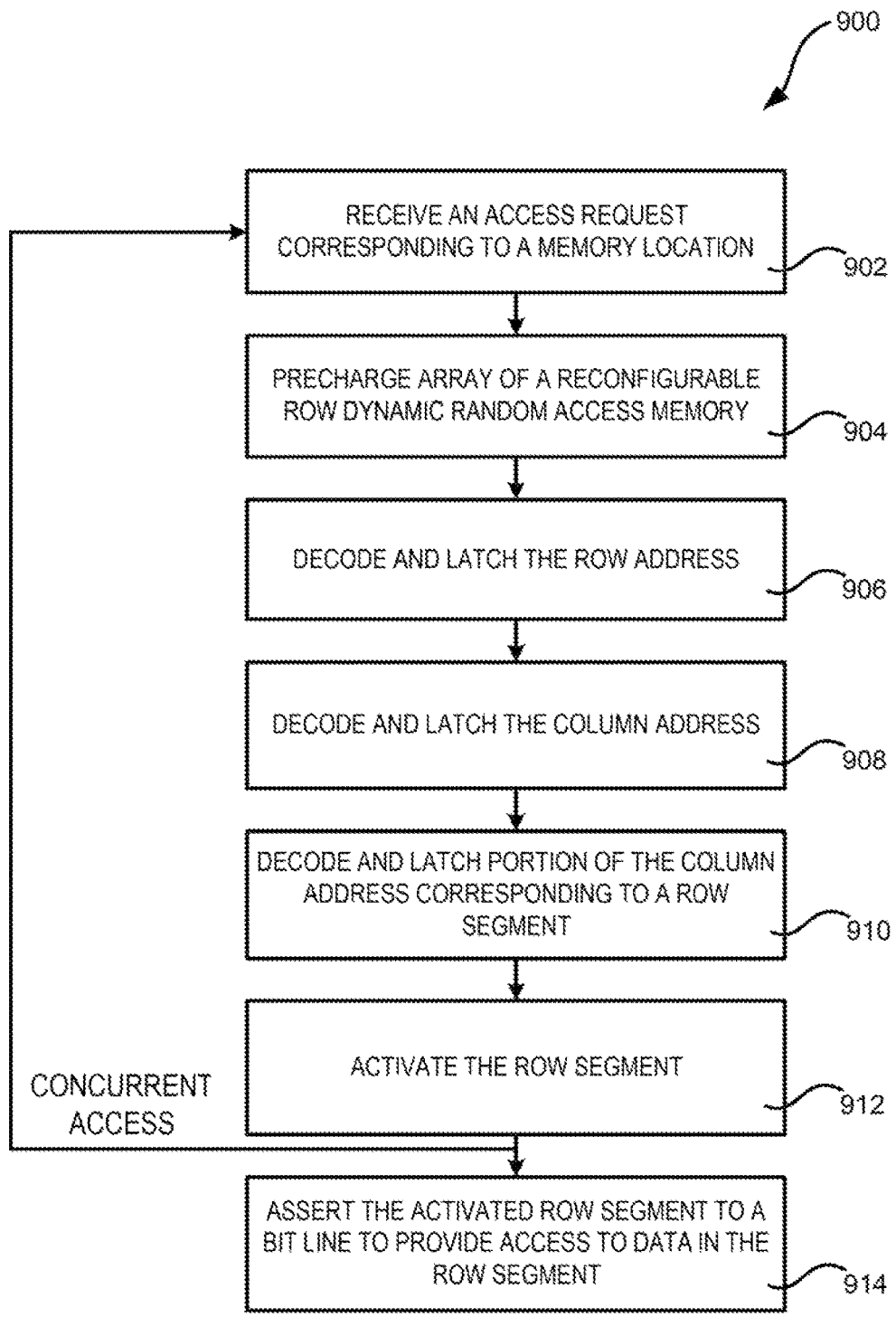
FIG. 9 is a flow diagram illustrating an example process for operation of an example RRDRAM device.

FIG. 9 is a flow diagram illustrating an example process for operation of a RRDRAM, such as the RRDRAM device 102 of FIG. 1, in accordance with at least some embodiments described herein. The operations of any process described herein are not necessarily presented in any particular order and performance of some or all of the operations in an alternative order(s) is possible and is contemplated. The operations have been presented in the demonstrated order for ease of description and illustration. Operations may be added, omitted, modified, combined, supplemented, and/or performed simultaneously or separately, without departing from the scope of the subject matter.

The illustrated processes can be ended at any time and need not be performed in its entirety. Some or all operations of the processes, and/or substantially equivalent operations, can be performed by execution of computer-readable instructions included on a computer storage media, as defined herein. The term "computer-readable instructions," and variants thereof, as used in the description and claims, is used expansively herein to include routines, applications, application modules, program modules, programs, components, data structures, algorithms, or the like. Computer-readable instructions can be implemented on various system configurations, including single-processor or multiprocessor systems, minicomputers, mainframe computers, personal computers, hand-held computing devices, microprocessor-based, programmable consumer electronics, combinations thereof, or the like. For purposes of illustrating and describing the concepts of the present disclosure, the process 900 is described as being performed, at least in part, by the RRDRAM device 102 of FIG. 1. This embodiment is illustrative, and should not be viewed as being limiting in any way.

The process 900 may begin at operation 902, where an access request may be received and which may correspond to a memory location. In some examples, the access request may be received from the memory controller 326. The access request may include address information of the data to be retrieved. The address information may include a column address, a row address and control.

The process 900 may continue to operation 904, where the DRAM array 112 of the RRDRAM device 102 may be precharged. In some examples, precharging the DRAM array 112 may bring the DRAM array 112 to a particular voltage, making the DRAM array 112 available for memory operations. Thereafter, a reading current may be applied to a particular part of the DRAM array 112 to read the data.

The process 900 may continue to operation 906, where the row address may be latched at the row address latch 308A and decoded at the row address decoder 308B. The process also may continue to operation 908, where the column address may be latched at the column address latch 310A and may be decoded at the column address decoder 310B.

The process 900 may continue to operation 910, where the portion of the column address corresponding to a row segment may be decoded and latched at the column decoder latch 312. In some examples, the portion of the memory address for a particular segment may be associated with the segment.

The process 900 may continue to operation 912, where the row segment previously latched at the column decoder latch 312 may be activated. The activation of the row segment makes the row segment available for memory operations.

As described in FIGS. 4 and 5 above, an RRDRAM device, such as the RRDRAM device 102 of FIG. 1, may be operated in various ways, such as a burst mode or a pipelined mode. In both examples, a simultaneous access to the DRAM array 112 may be performed while the previous access is occurring. This is illustrated by way of example in FIG. 9 as a split operation after operation 912, where the process 900 may continue to operation 902 for a concurrent access while the prior access is occurring and/or to operation 914, where the activated row segment may be asserted to a bit line to provide access to the data in the row segment. Concurrent accesses of multiple row segments may provide a logical row.

Figure 10:
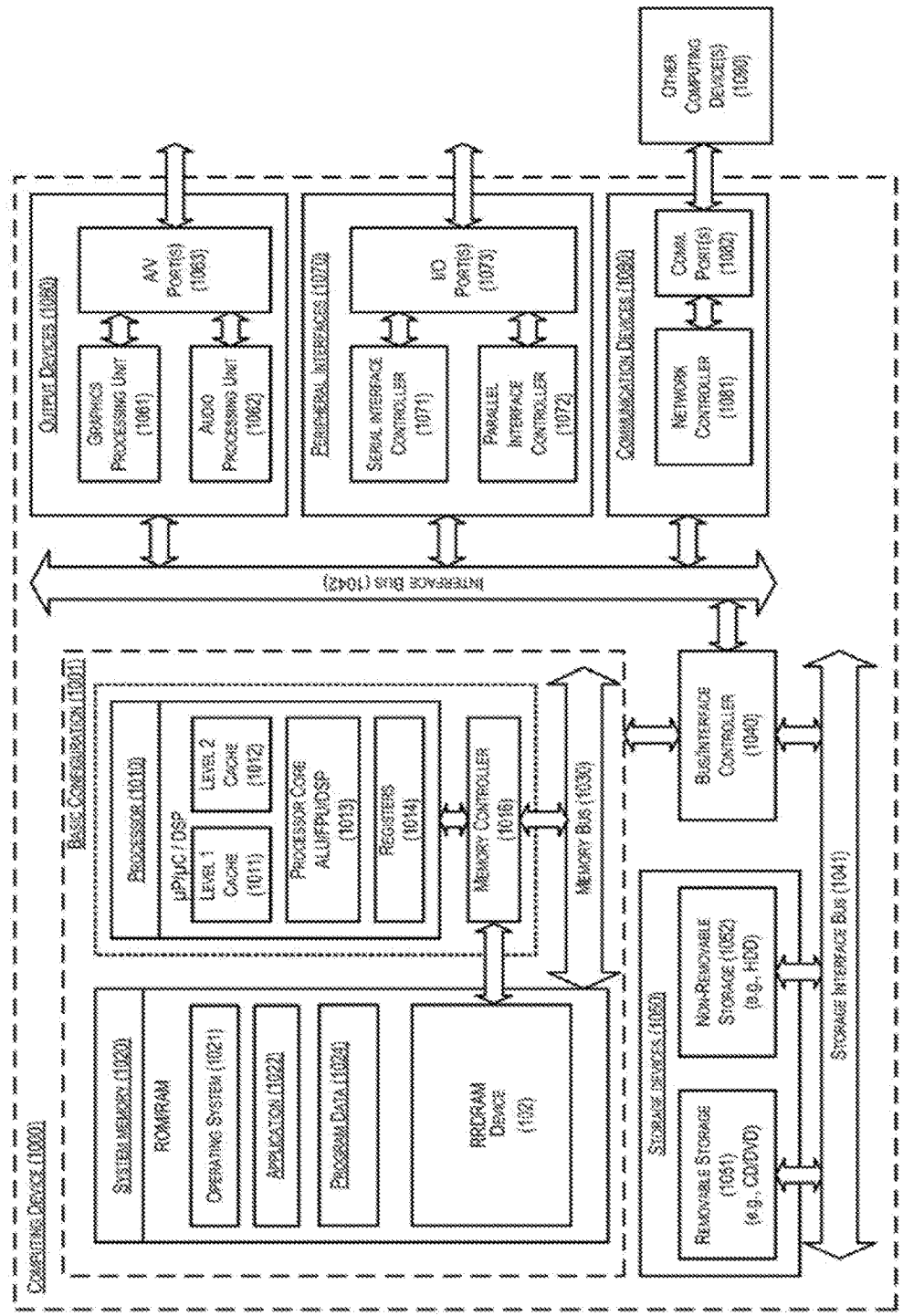
FIG. 10 is a block diagram illustrating an example computing device that is arranged to implement an example RRDRAM device, all arranged according to at least some embodiments presented herein.

FIG. 10 is a block diagram illustrating an example computing device 1000 that is arranged to implement a RRDRAM device, such as the RRDRAM device 102 and/or any other RRDRAM device described herein, in accordance with at least some embodiments described herein. In a very basic configuration, computing device 1000 includes one or more processors 1010 (which may be used to implement the processors 118) and system memory 1020 (which may be used to implement the RRDRAM device 102 and/or any other RRDRAM device described herein). A memory bus 1030 can be used for communicating between the processor 1010 and the system memory 1020.

Depending on the desired configuration, the processor 1010 can be of any type including but not limited to a microprocessor ("µP"), a microcontroller ("µC"), a digital signal processor ("DSP"), or any combination thereof. Processor 1010 can include one or more levels of caching, such as a level one cache 1011 and a level two cache 1012, a processor core 1013, and registers 1014. The processor core 1013 can include an arithmetic logic unit ("ALU"), a floating point unit ("FPU"), a digital signal processing core ("DSP core"), or any combination thereof. A memory controller 1016 (which can be used to implement the memory controller 326 of FIG. 3, for example) can also be used with the processor 1010, or in some implementations, the memory controller 1016 can be an internal part of the processor 1010.

Depending on the desired configuration, the system memory 1020 can be of any type including but not limited to volatile memory (such as RAM), nonvolatile memory (such as ROM, flash memory, etc.) or any combination thereof, including the RRDRAM device 102 and other RRDRAM device(s) described above or element(s) thereof described herein. System memory 1020 typically includes an operating system 1021, one or more applications 1022, and program data 1024. Application 1022 can include instructions that allow the processor 1010 to use the memory to perform operations on program data 1024 that may be based on a set of instructions generated for the specific application by utilizing memory controller 1016 to access the system memory 1020. Program Data 1024 includes data that is useful for implementing or operating a RRDRAM device. In some embodiments, application 1022 can be arranged to operate with program data 1024 on an operating system 1021 such that various components of the computing device can implement or operate the RRDRAM device. This described basic configuration is illustrated in FIG. 10 by those components within dashed line 1001.

Computing device 1000 can have additional features or functionality, and additional interfaces to facilitate communications between the basic configuration 1001 and any required devices and interfaces. For example, a bus/interface controller 1040 can be used to facilitate communications between the basic configuration 1001 and one or more data storage devices 1050 via a storage interface bus 1041. The data storage devices 1050 can be removable storage devices 1051, non-removable storage devices 1052, or a combination thereof. Examples of removable storage and non-removable storage devices include magnetic disk devices such as flexible disk drives and hard-disk drives ("HDDs"), optical disk drives such as compact disk ("CD") drives or digital versatile disk ("DVD") drives, solid state drives ("SSDs"), and tape drives to name a few. Example computer storage media can include volatile and nonvolatile, removable and non-removable media implemented in any method or technology for storage of information, such as computer readable instructions, data structures, program modules, or other data.

System memory 1020, removable storage devices 1051 and non-removable storage devices 1052 are all examples of computer storage media. Computer storage media includes, but is not limited to, RAM, ROM, EEPROM, flash memory or other memory technology, CD-ROM, digital versatile disks ("DVDs") or other optical storage, magnetic cassettes, magnetic tape, magnetic disk storage or other magnetic storage devices, or any other medium which can be used to store the desired information and which can be accessed by computing device 1000. Any such computer storage media can be part of computing device 1000.

Computing device 1000 can also include an interface bus 1042 for facilitating communication from various interface devices (e.g., output interfaces, peripheral interfaces, and communication interfaces) to the basic configuration 1001 via the bus/interface controller 1040. Example output devices 1060 include a graphics processing unit 1061 and an audio processing unit 1062, which can be configured to communicate to various external devices such as a display or speakers via one or more A/V ports 1063. Example peripheral interfaces 1070 include a serial interface controller 1071 or a parallel interface controller 1072, which can be configured to communicate with external devices such as input devices (e.g., keyboard, mouse, pen, voice input device, touch input device, etc.) or other peripheral devices (e.g., printer, scanner, etc.) via one or more I/O ports 1073.

An example communication device 1080 includes a network controller 1081, which can be arranged to facilitate communications with one or more other computing devices 1090 over a network communication via one or more communication ports 1082. The communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, communication media can include wired media such as a wired network or direct-wired connection, and wireless media such as acoustic, radio frequency ("RF"), infrared ("IR") and other wireless media. The term computer readable media as used herein can include both storage media and communication media. Storage media does not encompass communication media.

Computing device 1000 can be implemented as a portion of a small-form factor portable (or mobile) electronic device such as a cell phone, a personal data assistant ("PDA"), a personal media player device, a wireless web-watch device, a personal headset device, an application specific device, or a hybrid device that include any of the above functions. Computing device 1000 can also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, are possible. Such modifications and variations are intended to fall within the scope of the appended claims. The present disclosure is to be limited only by the terms of the appended claims, along with the full scope of equivalents to which such claims are entitled. This disclosure is not limited to particular methods, compounds, or compositions, which can, of course, vary. The terminology used herein is for the purpose of describing particular embodiments only, and is not intended to be limiting.

For example, other types of circuits may be used in lieu of row segment latches, a segment decoder activator circuit, and the like. Further, the processes of latching and decoding have been described for purposes of illustrating a configuration of the presently disclosed subject matter. Other memory access technologies and techniques may be used and are still considered to be within the scope of the present disclosure. Additionally, for purposes of clarity, one or more components of the circuits in the figures may not be illustrated but may be included. The circuits illustrated are not limited to the components illustrated and may include more or fewer components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). If a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations.

However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general, such a construction is intended in the sense one having skill in the art would understand the convention (e.g., "a system having at least one of A, B, and C" would include, but not be limited to, systems that have A alone, B alone, C alone, A and B together, A and C together, B and C together, and/or A, B, and C together, etc.). Any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group. Further, the use of the terms "first," "second," "third," "fourth," and the like is to distinguish between repeated instances of a component or a step in a process and does not impose a serial or temporal limitation unless specifically stated to require such serial or temporal order.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," or the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments will be apparent. The various aspects and embodiments disclosed herein are for purposes of illustration and are not intended to be limiting, with the true scope and spirit being indicated by the following claims.

What is claimed is:

1. A method to operate a reconfigurable row dynamic random access memory (RRDRAM) device, the method comprising:
   receiving a first access request for a first access to the RRDRAM device, the first access request including address information for a first row address and a first column address corresponding to a first memory location in an array;
   precharging the array associated with the first memory location;
   decoding the first row address;
   decoding a portion of the first column address to identify a first row segment of the first row address;
   activating the identified first row segment;
   asserting the activated first row segment to a word line to provide access to data in the activated first row segment;
   receiving a second access request for a second access that includes address information for a second row address and a second column address corresponding to a second memory location in the array;
   decoding the second row address;
   decoding a portion of the second column address to identify a second row segment of the second row address; and
   activating the identified second row segment to generate an activated second row segment.

2. The method of claim 1, further comprising activating a column corresponding to the first column address to generate an activated column.

3. The method of claim 2, further comprising maintaining the activated column corresponding to the first column address as active during the second access to the RRDRAM device.

4. The method of claim 1, further comprising asserting the activated second row segment to a word line to provide access to data in the activated second row segment.

5. The method of claim 1, further comprising operating the RRDRAM device in a pipeline mode of operation by asserting the activated first row segment to the word line after the first access is complete.

6. The method of claim 1, further comprising operating the RRDRAM device in a burst mode of operation by asserting the activated first row segment and the activated second row segment after the first access and the second access to the RRDRAM device are complete.

7. A reconfigurable row dynamic random access memory (RRDRAM) device, comprising:
   an array comprising:
      a plurality of rows, wherein each of the plurality of rows includes at least two row segments, and
      a plurality of columns;
   a row address latch coupled to the array, wherein the row address latch is operative to latch a first row address and a second row address of the array;
   a row decoder coupled to the row address latch, wherein the row decoder is operative to decode the latched first row address and the latched second row address;
   a column address latch coupled to a memory address line and operative to latch a first column address and a second column address of the array;

a column decoder coupled to the column address latch and operative to decode the latched first column address and the latched second column address of the array;

a column decoder latch coupled to the column decoder and operative to latch and maintain active an accessed column of the array;

a segment decoder coupled to the column address latch and operative to:
 decode a portion of the first column address to identify a first row segment in the array, and
 decode a portion of the second column address to identify a second row segment in the array; and a segment decoder activator circuit coupled to the segment decoder and operative to activate a row segment latch, wherein the row segment latch is coupled to the row decoder and the segment decoder activator circuit, and wherein the row segment latch is operative to latch and activate the first row segment and the second row segment.

8. The RRDRAM device of claim 7, further comprising a row clock coupled to the row segment latch, wherein the row clock is operative to control the activation and access to the at least two row segments.

9. The RRDRAM device of claim 7, wherein the segment decoder activator circuit comprises a flip-flop circuit.

10. The RRDRAM device of claim 7, wherein the segment decoder activator circuit comprises a feedback loop operative to store the at least two row segments in the row segment latch and maintain an active output unchanged during a plurality of accesses.

11. The RRDRAM device of claim 7, wherein the column decoder latch comprises a plurality of flip-flop circuits, wherein each of the plurality of flip-flop circuits respectively corresponds to a different column of the plurality of columns, wherein each of the plurality of flip-flop circuits is operative to store data associated with an access to the corresponding column.

12. A computer system, comprising:
 a bus;
 a processor unit coupled to the bus; and
 a reconfigurable row dynamic random access memory (RRDRAM) device coupled to the bus, the RRDRAM device operative to perform operations that cause the RRDRAM device to:
  precharge a memory array associated with a first memory location in the memory array;
  utilize a row decoder to decode a first row address associated with the first memory location;
  utilize a column decoder latch to decode and latch a portion of a first column address associated with the first memory location to identify a first row segment of the memory array;
  utilize a row segment activator to activate the first row segment;
  assert the activated first row segment to a first word line to provide access to data in the first row segment;
  utilize the row decoder to decode a second row address associated with a second memory location;
  utilize the column decoder latch to decode and latch a portion of a second column address associated with the second memory location to identify a second row segment of the memory array;
  utilize the row segment activator to activate the second row segment; and
  assert the activated second row segment to a second word line to provide access to data in the second row segment.

13. The computer system of claim 12, wherein the row segment activator comprises:
 a transistor that includes a first port coupled to the row decoder, a second port coupled to a first terminal of a capacitor, and a control terminal coupled to a segment decoder; and
 the capacitor having a first terminal coupled to the second port of the transistor and a second terminal coupled to a reference voltage, and wherein the row segment activator is operative to charge to a potential in response to an active output of the row decoder.

14. The computer system of claim 12, wherein the RRDRAM device further comprises a first-in/first-out system operative to access data in the RRDRAM device by an order of arrival of access requests in an address bus.

15. The computer system of claim 12, wherein the row segment activator comprises a capacitor.

16. The computer system of claim 12, wherein the column decoder latch comprises:
 a plurality of flip-flops operative to store data associated with accesses to the RRDRAM device; and
 a feedback loop operative to maintain an active output unchanged during accesses to the RRDRAM device.

17. A method to operate a reconfigurable row dynamic random access memory (RRDRAM) device, the method comprising:
 receiving a first memory access of a memory access line, wherein the first memory access corresponds to a first access row address and a first access column address;
 decoding the first access row address to generate a decoded first row;
 decoding the first access column address to generate a decoded first column;
 decoding a portion of the first access column address to identify a first accessed row segment;
 activating an output corresponding to the first accessed row segment and concurrently with activating the output corresponding to the first accessed row segment, receiving a second memory access of the memory access line, wherein the first memory access corresponds to a second access row address and a second access column address;
 accessing first data associated with the first memory access by asserting an active column;
 decoding the second access row address to generate a decoded second row;
 decoding the second access column address to generate a decoded second column;
 decoding a portion of the second access column address to identify a second accessed row segment;
 activating an output corresponding to the second accessed row segment; and
 accessing second data associated with the second memory access by asserting the second accessed row segment.

18. The method of claim 17, wherein accessing the second data associated with the second access by asserting the second accessed row segment is performed subsequent to accessing the first data associated with the first access.

19. The method of claim 17, wherein decoding the portion of the first access column address to identify the first accessed row segment or decoding the portion of the second access column address to identify the second accessed row segment comprises extracting a segment identifier from the first access column address or the second access column address.

* * * * *